(12) United States Patent
Egard et al.

(10) Patent No.: US 9,117,753 B2
(45) Date of Patent: Aug. 25, 2015

(54) PROCESS FOR MANUFACTURING A SEMICONDUCTOR DEVICE AND AN INTERMEDIATE PRODUCT FOR THE MANUFACTURE OF A SEMICONDUCTOR DEVICE

(75) Inventors: Mikael Egard, Lund (SE); Erik Lind, Lund (SE); Lars-Erik Wernersson, Lund (SE)

(73) Assignee: Acconeer AB, Malmö (SE)

( * ) Notice: Subject to any disclaimer, the term of this patent is extended or adjusted under 35 U.S.C. 154(b) by 0 days.

(21) Appl. No.: 14/123,479

(22) PCT Filed: Jun. 1, 2012

(86) PCT No.: PCT/EP2012/060430
§ 371 (c)(1),
(2), (4) Date: Dec. 2, 2013

(87) PCT Pub. No.: WO2012/164082
PCT Pub. Date: Dec. 6, 2012

(65) Prior Publication Data
US 2014/0106553 A1    Apr. 17, 2014

(30) Foreign Application Priority Data

Jun. 3, 2011 (WO) .................. PCT/EP2011/059190
May 29, 2012 (TW) .............................. 101119230 A

(51) Int. Cl.
*H01L 21/28* (2006.01)
*H01L 29/423* (2006.01)
(Continued)

(52) U.S. Cl.
CPC ...... *H01L 21/28114* (2013.01); *H01L 29/4236* (2013.01); *H01L 29/42316* (2013.01); *H01L 29/42376* (2013.01); *H01L 29/66462* (2013.01); *H01L 29/66469* (2013.01); *H01L 29/66522* (2013.01); *H01L 29/66545* (2013.01); *H01L 29/66795* (2013.01); *H01L 21/31144* (2013.01); *H01L 21/823431* (2013.01); *H01L 21/845* (2013.01); *H01L 29/20* (2013.01);
(Continued)

(58) Field of Classification Search
None
See application file for complete search history.

(56) References Cited

U.S. PATENT DOCUMENTS 5,929,467 A    7/1999    Kawai
6,127,233 A    10/2000    Rodder
(Continued)

OTHER PUBLICATIONS

Moran, D.A.J., et al., "50-nm Self-Aligned and 'Standard' T-Gate InP pHEMT Comparison: The Influence of Parasitics on Performance at the 50-nm Node," IEEE Transactions on Electron Devices 53(12):2920-2925, Dec. 2006.
(Continued)

*Primary Examiner* — Angel Roman
(74) *Attorney, Agent, or Firm* — Christensen O'Connor Johnson Kindness PLLC

(57) ABSTRACT

According to one aspect of the inventive concept there is provided a process for manufacturing a semiconductor device, comprising: providing a channel layer (104), providing a mask (106) on the channel layer, epitaxially growing a contact layer (108) in contact with the channel layer, epitaxially growing a support layer (110) on the contact layer, wherein the support layer is arranged to be etched at a higher rate than the contact layer, forming a trench extending through the support layer by removing the mask, and providing a conductor (118) in the trench. There is also provided an intermediate product for the manufacture of a semiconductor device.

20 Claims, 11 Drawing Sheets

(51) Int. Cl.
  *H01L 29/66* (2006.01)
  *H01L 21/311* (2006.01)
  *H01L 29/20* (2006.01)
  *H01L 29/49* (2006.01)
  *H01L 29/51* (2006.01)
  *H01L 29/778* (2006.01)
  *H01L 21/8234* (2006.01)
  *H01L 21/84* (2006.01)

(52) U.S. Cl.
  CPC ............ *H01L 29/495* (2013.01); *H01L 29/517* (2013.01); *H01L 29/66871* (2013.01); *H01L 29/7787* (2013.01)

(56) References Cited

U.S. PATENT DOCUMENTS

| | | | |
|---|---|---|---|
| 6,187,641 | B1 | 2/2001 | Rodder |
| 6,291,832 | B1* | 9/2001 | Krivokapic ............ 257/25 |
| 2006/0157797 | A1* | 7/2006 | Tateshita ............ 257/369 |
| 2012/0007051 | A1* | 1/2012 | Bangsaruntip et al. ........ 257/24 |
| 2012/0122286 | A1* | 5/2012 | Kim et al. ............ 438/300 |

OTHER PUBLICATIONS

Parikh, P.A., et al., "A New FET-Based Integrated Circuit Technology: The SASSFET," IEEE Electron Device Letters 17(7):375-377, Jul. 1996.

Park, J., and C. Hu, "Gate Last MOSFET With Air Spacer and Self-Aligned Contacts for Dense Memories," International Symposium on VLSI Technology, Systems, and Applications (VLSI-TSA '09), Hsinchu, Taiwan, Apr. 27-29, 2009, pp. 105-106.

Radosavljevic, M., et al., "Advanced High-K Gate Dielectric for High-Performance Short-Channel In(0.7)Ga(0.3)As Quantum Well Field Effect Transistors on Silicon Substrate for Low Power Logic Applications," IEEE International Electron Devices Meeting (IEDM), Baltimore, Dec. 7-9, 2009, pp. 1-4.

Radosavljevic, M., et al., "Non-Planar, Multi-Gate InGaAs Quantum Well Field Effect Transistors With High-K Gate Dielectric and Ultra-Scaled Gate-to-Drain/Gate-to-Source Separation for Low Power Logic Applications," IEEE International Electron Devices Meeting (IEDM), San Francisco, Dec. 6-8, 2010, pp. 6.1.1-6.1.4.

Terao, R., et al., "InP/InGaAs Composite Metal-Oxide-Semiconductor Field-Effect Transistors With Regrown Source and $Al_2O_3$ Gate Dielectric Exhibiting Maximum Drain Current Exceeding 1.3mA/μm," Applied Physics Express 4(5):054201-1-054201-3, May 2011.

International Search Report and Written Opinion mailed Feb. 9, 2012, issued in corresponding International Application No. PCT/EP2011/059190, filed Jun. 3, 2011, 9 pages.

International Search Report and Written Opinion mailed Sep. 12, 2012, issued in corresponding International Application No. PCT/EP2012/060430, filed Jun. 1, 2012, 9 pages.

\* cited by examiner

PROCESS FOR MANUFACTURING A SEMICONDUCTOR DEVICE AND AN INTERMEDIATE PRODUCT FOR THE MANUFACTURE OF A SEMICONDUCTOR DEVICE

FIELD OF THE INVENTIVE CONCEPT

The present inventive concept relates to a process for manufacturing a semiconductor device. There is also provided an intermediate product for the manufacture of a semiconductor device.

BACKGROUND

There is a constant strive in the industry to manufacture ever more compact, fast and energy efficient electronic circuits. To this end much effort has been put into developing methods for fabricating smaller and faster semiconductor devices, inter alia transistors.

In the prior art, field effect transistors (FETs) such as metal-insulator-semiconductors (MISFETs) have been fabricated in so-called gate-first processes wherein the gate is formed over a channel layer before formation of the source and drain regions. The source and drain regions are often formed by a highly doped semiconductor. One advantage of the gate-first process is that it is comparably simple to design the process such that the gate becomes self-aligned to the channel region (i.e. between the source and drain regions) and thus limit the series resistance between the source and drain. One drawback is however that during the formation of the source and drain regions the interface between the gate and the channel layer may be adversely affected by high temperature processing such as ion implantation followed by doping activation anneal, or by regrowth processes performed at elevated temperatures. This must be considered when designing the gate-channel interface and may thus limit the design options. A further drawback specific to doping by ion implantation is that implantation processes not are efficient for all materials. For example, implantation in III/V materials generally results in poor contact material quality.

An alternative process is the so-called gate-last process wherein the source and drain regions are formed before the gate is fabricated on the substrate. Thereby degradation of the gate-channel interface during fabrication of the transistor may be avoided or at least reduced. However, special attention is required when designing the process to ensure that the gate becomes accurately aligned with the channel region.

US 2006/0286755 discloses a gate-last method of fabricating PMOS and NMOS transistors wherein the gate becomes self-aligned. According to the method a dummy gate structure is fabricated on a silicon layer of a SOI substrate. Thereafter the silicon layer is etched such that the etch undercuts the dummy gate structure, thereby achieving a thinning of the channel region. Highly doped source and drain regions are then epitaxially grown on the etched silicon layer on opposite sides of the dummy gate structure. A dielectric layer is deposited over the resulting structure to cover the source region, the drain region and the dummy gate structure. The dielectric layer is planarized in a chemical mechanical polishing (CMP) process to become flush with the top surface of the dummy gate structure. By the deposition of the dielectric layer and the following planarization step the dummy gate structure may thereafter be etched away wherein a trench extending through the dielectric layer may be formed and subsequently filled with a metal gate.

This method however imposes constraints on the design of the gate. In order to enable removal of the dummy gate structure, the dummy structure must be accessible from the surface of the planarized dielectric layer. The height of the gate above the silicon layer is thus restricted by the height of the dummy gate structure. This may render it more difficult to define shorter gate lengths since the minimum aspect ratio of the gate is determined inter alia by the maximum aspect ratio of the dummy gate structure. Moreover the two separate processes of depositing the dielectric layer and planarizing the same which are performed before the gate can be formed adds to the complexity of the method.

SUMMARY OF THE INVENTIVE CONCEPT

An objective of the present inventive concept is to provide a process of manufacturing a semiconductor device having a self-aligned gate and which reduces at least some of the above mentioned design limitations imposed by the prior art methods. These and further objects will be understood from the following.

According to a first aspect of the inventive concept there is provided a process for manufacturing a semiconductor device, comprising: providing a channel layer, providing a mask on the channel layer, epitaxially growing a contact layer in contact with the channel layer, epitaxially growing a support layer on the contact layer, wherein the support layer is arranged to be etched at a higher rate than the contact layer, forming a trench extending through the support layer by removing the mask, and providing a conductor in the trench.

According to the inventive aspect there is provided a manufacturing process of comparably low complexity which enables fabrication of a semiconductor device, such as a transistor, including a gate which is self-aligned to the source and drain region and hence the channel region.

By providing the conductor in the trench after growing the contact and support layers, exposure of the interface between the conductor and the channel layer to high temperature processes may be avoided.

By epitaxially growing the contact layer a highly doped contact layer may be obtained in a wide range of materials such as III/V materials, IV materials, II/VI materials, and combinations thereof.

By epitaxially growing the contact layer and the support layer the trench may be formed without the use of any etch stop layer. An etch stop layer may in some cases limit the performance of the semiconductor device as it may add undesired additional resistance to the device.

By epitaxially growing the support layer the process provides design flexibility in that it becomes possible to control the shape of the trench and consequently also the shape of the conductor simply by controlling the growth conditions at the edges of the mask. Moreover, the support layer may be grown to extend above the mask, as viewed in the growth direction of the support layer, without overgrowing the mask. The conductor may thus be designed without being limited by the maximum obtainable aspect ratio of the mask. The length of the base of the conductor may thus be reduced which, in terms of a transistor, implies that the gate length may be reduced.

Since the support layer is arranged to be etched at a higher rate than the contact layer, the support layer may be selectively etched off the contact layer substantially without affecting the contact layer. This enables convenient access to the contact layer for external connections. An additional advantage resulting from this property is that the semiconductor device may be made high frequency compatible since a capacitive coupling between the conductor and the support layer may be eliminated.

According to one embodiment the support layer is grown such that the trench presents an increasing dimension along a growth direction of the support layer. The trench may thus be provided with beveled edges, i.e. beveled facets. This makes it possible to obtain a support layer of increased thickness with a reduced risk of overgrowing the mask. Consequently, when manufacturing a transistor it enables formation of a gate of increased size wherein the gate resistance may be reduced. This may be a desirable property of a transistor, especially for high frequency applications.

According to one embodiment the support layer is grown such that the support layer extends beyond the mask in a growth direction of the support layer. A conductor having a stem of increased height and a base of small length may thus be obtained.

According to one embodiment the contact layer is grown on the surface of the channel layer. This enables a manufacturing process including a comparably small number of process steps.

According to one embodiment, the process comprises reducing a thickness of the channel layer in a region not covered by the mask and then growing the contact layer on the channel layer of reduced thickness. Thereby, an overlap between the contact layer and the conductor in the growth direction of the contact layer may be reduced. The capacitive coupling between the conductor and the contact layer may hence be controlled. Conversely, the thickness of the contact layer may be increased while controlling the overlap with the conductor. An increased thickness of the contact layer may imply a reduced resistance of the contact layer.

According to one embodiment the process further comprises: providing a barrier layer, on which the channel layer is provided, and epitaxially growing the contact layer on a surface of the barrier layer not covered by the channel layer. Thereby the contact layer may be submerged into the channel layer. This enables the overlap between the conductor and the contact layer to be reduced. The capacitive coupling between the conductor and the contact layer may thereby be controlled. Conversely, the thickness of the contact layer may be increased while controlling the overlap with the conductor. The surface of the barrier layer not covered by the channel layer may be formed by removing the channel layer in a region not covered by the mask.

The process may further comprise reducing a thickness of the barrier layer in a region not covered by the mask and then growing the contact layer on the barrier layer of reduced thickness. Thereby the contact layer may be submerged into both the channel layer and the barrier layer. This enables a further reduction of the overlap between the contact layer and the conductor.

According to one embodiment the thickness of the barrier layer is reduced by etching and the barrier layer includes an etch stop layer. Thereby accurate control of the etch depth may be achieved.

According to one embodiment the contact layer is grown on the barrier layer to a thickness such that the contact layer does not overlap the conductor in a growth direction of the contact layer. The capacitive coupling between the conductor and the contact layer may thereby be reduced.

According to one embodiment the conductor is provided in the trench such that the conductor is insulated from the channel layer. More specifically the conductor may be provided in the trench such that the conductor is insulated from an active, i.e. conducting, layer section of the channel layer. The conductor may be insulated by providing an insulating layer in the trench. The insulating layer may include a dielectric. Alternatively or additionally the channel layer may include a barrier layer section arranged to insulate, at least partly, a conducting layer section of the channel layer from the conductor. The barrier layer section may be provided as an upper barrier layer section in the channel layer.

According to one embodiment the process further comprises providing a first insulating layer on the channel layer in the trench prior to providing the conductor in the trench. The first insulating layer is thus provided in the trench after the process of growing the contact layer and the support layer and removing the mask. The first insulating layer will hence not be exposed to the adverse conditions which may prevail during the growing of the contact layer and support layer.

According to one embodiment the process further comprises providing the conductor with a second insulating layer, the second insulating layer having a lower dielectric constant than the first insulating layer. The first insulating layer may include a high k dielectric material. The second insulating layer may be a low k dielectric material. Undesired capacitive coupling between the conductor and other parts of the device (such as the contact layer or a metallic connection layer) may thus be reduced. Meanwhile, a strong capacitive coupling may be maintained between the conductor and the channel layer by means of the first insulating layer.

The second insulating layer may be provided on a side surface of the trench prior to providing the conductor in the trench. In the finished device, the second insulating layer may thus be arranged in contact with the side surfaces of the conductor. Portions of the first insulating layer present on the outside of the second insulating layer may be removed. Thus a further reduction in the capacitive coupling may be achieved. Moreover, according to this option, the length of the base of the conductor may be controlled via the thickness of the second insulating layer. The removed portions of the first insulating layer may be portions not contributing appreciably to the capacitive coupling between the conductor and the channel layer. The removed portions of the first insulating layer may be portions not arranged between the conductor and the channel layer.

Alternatively, the conductor may be provided with the second insulating layer after a removal of the support layer. Optionally the second insulating layer may be provided after removal of the support layer and after removing portions of the first insulating layer from the conductor. The removed portions of the first insulating layer may be portions not contributing appreciably to the capacitive coupling between the conductor and the channel layer. The removed portions of the first insulating layer may be portions not arranged between the conductor and the channel layer.

According to one embodiment the process further comprises removing the support layer by etching. Since the support layer is arranged to be etched at a higher rate than the contact layer, the support layer may be selectively etched off the contact layer substantially without affecting the contact layer. This enables convenient access to the contact layer for connection with other electrical components. An additional advantage resulting from this property is that the resulting semiconductor device may be high frequency compatible since a capacitive coupling between the conductor and the support layer may be eliminated.

The removal of the support layer may optionally be preceded by removing the first insulating layer from the support layer in a region not covered by the conductor.

According to one embodiment the process further comprises providing a connection layer on the contact layer. The connection layer may be provided after the support layer has been removed. By providing two such connection layers on the contact layer on opposite sides of the conductor, the connection layers may form connection points for other electrical components. In terms of a transistor, the connection layers may form source and drain contacts.

The connection layer may be provided by evaporation wherein the conductor is used as a shadow mask. The connection layer may thereby be arranged close to the conductor in a self-aligned manner. The series resistance between the connection layer and the channel layer may thereby be reduced.

If the conductor is provided with the second insulating layer, the separation between the connection layer and the conductor may be controlled via the thickness of the second insulating layer. Moreover, the capacitive coupling between the connection layer and the conductor may be reduced.

The connection layer may be provided by tilted evaporation. The connection layer may thus be arranged on the contact layer close to the conductor even if the upper portion of the conductor protrudes over, and thus shadows the contact layer.

According to one embodiment the process the conductor is provided in the trench by filling the trench with the conductor such that the conductor extends outside the trench. A comparably large conductor may thus be obtained wherein a resistance of the conductor may be reduced. This may be advantageous in analog transistor applications wherein high frequency operation and low gate resistance is an important factor.

According to one embodiment the process further comprises removing portions of the conductor extending outside the trench. A comparably small conductor may thus be obtained wherein a volume efficient device may be obtained. This may be advantageous in digital transistor applications, e.g. Very-Large-Scale Integration (VLSI) applications, wherein a small device dimension is an important factor.

According to one embodiment the mask on the channel layer is formed from hydrogen silsesquioxane (HSQ). The mask may thus be conveniently defined by irradiating the HSQ with an electron beam which may be precisely controlled, or by optical lithography. Accurate control of the dimensions of the trench may thus be achieved. Additionally, HSQ requires a lower process temperature than conventional hard masks formed by chemical vapor deposition (CVD) and a subsequent etching step and may thus affect the device less.

According to one embodiment the channel layer is provided on a substrate. The substrate may include a base layer. The base layer may include a buffer layer. A barrier layer may be arranged on the base layer wherein the channel layer is provided on the barrier layer. The barrier layer may be arranged on the buffer layer of the base layer.

According to one embodiment the channel layer is provided on a substrate on which a resonant tunneling structure is arranged. This enables formation of a resonant tunneling diode and a transistor on a single substrate. The semiconductor device and the resonant tunneling structure may be formed by semiconductor materials selected from the III/V material group. Materials from this group enable formation of resonant tunneling structures of good performance. Moreover, as discussed above the process enables manufacturing of a transistor presenting a low resistance between the source and drain regions in III/V materials, wherein the resonant tunneling structure-transistor combination may be advantageously formed on a single substrate. The method may further comprise epitaxially growing the contact layer in contact with the channel layer and on the resonant tunneling structure.

According to one embodiment at least one of a material composition of the contact layer or a doping concentration of the contact layer is changed during the epitaxial growing of the contact layer. This provides an additional degree of freedom in designing the device. The contact layer may be epitaxially grown such that a doping concentration of the finished contact layer varies along a growth direction of the contact layer. Additionally or alternatively the contact layer may be epitaxially grown such that a band gap in the contact layer varies along a growth direction of the contact layer.

According to one embodiment the contact layer is epitaxially grown such that a doping concentration of the finished contact layer increases along a growth direction of the contact layer. Thereby parasitic effects in the contact layer and/or channel layer near the conductor region may be reduced. The parasitic effects may include for example electron or hole impact ionization, intra-band tunneling or inter-band tunneling. The parasitic effects may also include barrier lowering induced by the potential applied to the contact layer. In terms of a transistor such parasitic effects may deteriorate the off-state current at high electric field strengths in the gate-drain region. Varying the doping concentration in this manner enables the high electric field region formed in the channel layer-contact layer region to be extended, wherein the maximum electric field strength may be lowered. Furthermore, this may be achieved by altering properties along the growth direction of the contact layer and hence without increasing the lateral dimensions of the semiconductor device. Moreover, the contact layer may be provided with a comparably low doping concentration in a lower region of the contact layer, close to the channel layer. According to another embodiment, which also may enable a reduction of the above-mentioned adverse effects, the contact layer may be epitaxially grown such that a band gap of the finished contact layer decreases along a growth direction of the contact layer. A smaller band gap in an upper region of the contact layer may enable an improved ohmic contact with a connection layer, compared to a larger band gap. Optionally, these two embodiments may be combined in a single embodiment wherein the contact layer is epitaxially grown such that a doping concentration in at least a portion of the finished contact layer increases along a growth direction of the contact layer and such that a band gap in said at least a portion of the finished contact layer decreases along the growth direction of the contact layer. In either of these embodiments, the increase and/or decrease of the respective parameter may be gradual (continuously increasing/decreasing) or step wise.

According to one embodiment, the conductor is formed with a first portion overhanging a first region of the contact layer at a first side of the trench and a second portion overhanging a second region of the contact layer at a second side of the trench, wherein an extension of the overhang of the second portion exceeds an extension of the overhang of the first portion. An extension of the conductor outside the trench in a direction transverse to the growth direction of the support layer may differ between opposite sides of the trench. The connection layer may be provided on the contact layer by evaporation wherein the conductor is used as a shadow mask. By controlling the dimension of the overhangs the distance between the connection layer portion at the side of the overhang and the channel region below the conductor filled trench may be controlled. In terms of a transistor an overhang on a drain side enables the drain contact to be distanced from the active region of the channel layer under the gate. Hence, in use of the semiconductor device, a maximum electric field strength in the gate-drain region may be reduced wherein parasitic effects may be reduced.

According to a second aspect of the present inventive concept there is provided an intermediate product for the manufacture of a semiconductor device, comprising: a channel layer, an epitaxially grown contact layer in contact with the channel layer, a support layer epitaxially grown on the contact layer, wherein the support layer is arranged to be etched at a higher rate than the contact layer. The product may further include a mask or a conductor arranged in a trench extending through the support layer and optionally the contact layer. The conductor may be arranged in the trench such that it is insulated from the channel layer.

The intermediate product enables manufacturing of a high frequency compatible semiconductor device such as a transistor by selective etching of the support layer. The further advantages and details of the semiconductor device resulting from the above described process apply correspondingly to the semiconductor device obtainable from intermediate product.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings, where like reference numerals will be used for like or similar elements, wherein.

DETAILED DESCRIPTION OF PREFERRED EMBODIMENTS

Detailed embodiments of aspects of the present inventive concept will now be described with reference to the drawings.

A first embodiment of a process of manufacturing a semiconductor device in the form of a transistor, and more specifically a field effect transistor (FET), will now be described with reference to FIGS. 1a-g.

Figure 1A:
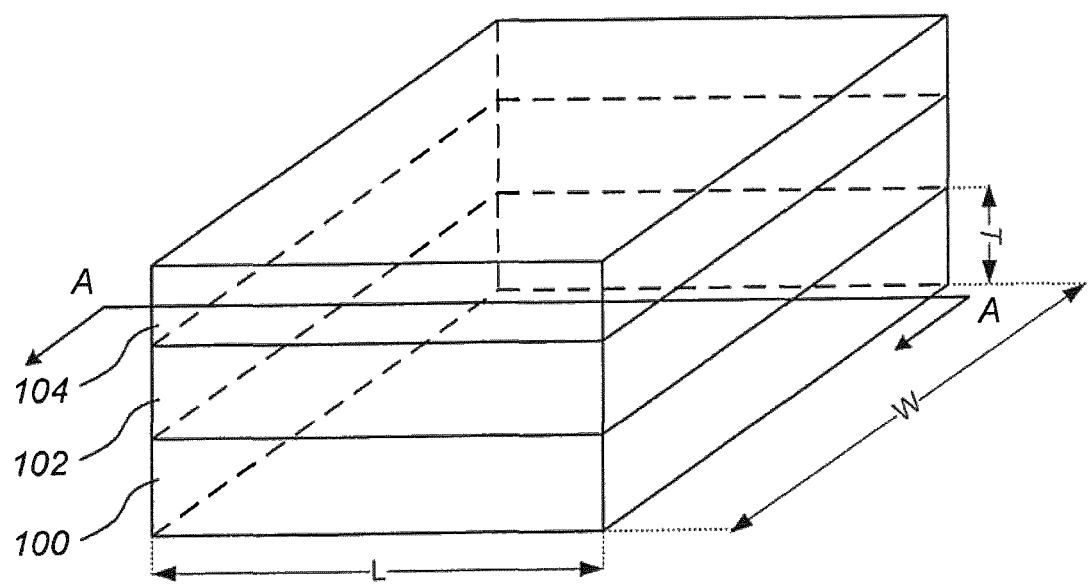
FIGS. 1a-g are schematic illustrations of a process of a first embodiment.

FIG. 1a illustrates a structure from which the device may be manufactured. The structure comprises a base layer 100. A barrier layer 102 is formed on the base layer 100. A channel layer 104 is formed on the barrier layer 102. The barrier layer 102 may be a semiconductor layer epitaxially grown on the base layer 100. The channel layer 104 may be a semiconductor layer epitaxially grown on the barrier layer 104.

Figure 1B:
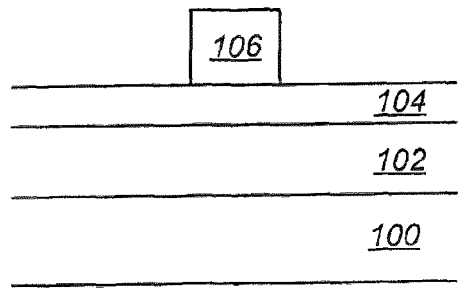

A mask 106 is arranged on the surface of the channel layer 104 as illustrated in FIG. 1b which shows a cross section of the structure taken according to the cut A-A indicated in FIG. 1a. The cut A-A extends in parallel with a length dimension L of the base layer 100. The cut A-A is perpendicular to the thickness dimension T of the base layer 100, defined by the growth direction of the layers. The cut A-A is also perpendicular to the width dimension W of the base layer 100, extending in parallel with the layers 100, 102, 104. The structure shown in FIG. 1a may represent a portion of a larger substrate, on which portion a single device may be formed. The substrate may thus include a plurality of such portions, wherein a device may be formed on each portion.

The mask 106 may be a hard mask. The mask 106 may be formed from a mask substance such as hydrogen silsesquioxane (HSQ). A mask layer may be deposited on the channel layer 104. The mask layer may be deposited using a spin-on process. By spinning the structure at an appropriate speed, a mask layer of desired thickness may be obtained. By spinning the structure faster the layer becomes thinner. By spinning the structure slower the layer becomes thicker. The dimensions of the mask may then be defined in a lithography process. The mask 106 may be defined by irradiating selected portions of the mask layer with an electron beam.

Alternatively, the mask 106 may be defined using optical lithography. A developer may then be applied wherein the portions of the mask layer not irradiated are removed and the irradiated portions form a hard mask. A HSQ layer may be fully or partly converted to a hard mask of $SiO_2$.

Alternatively the mask 106 may be formed by depositing $SiO_2$, W or $Si_3N_4$ over the entire surface of the channel layer 104. The deposition may e.g. be a chemical vapor deposition (CVD) step. The mask 106 may then be defined in a lithography step followed by an etching step or lift-off step wherein unwanted portions of the mask layer are removed and the mask 106 is formed.

More generally, the mask 106 may be formed from a material which is non-reactive with the channel layer, contact layer and support layer and whose properties not are altered appreciably when subjected to the elevated temperatures during the epitaxial growing of the contact layer and the support layer (see below).

Figure 1C:
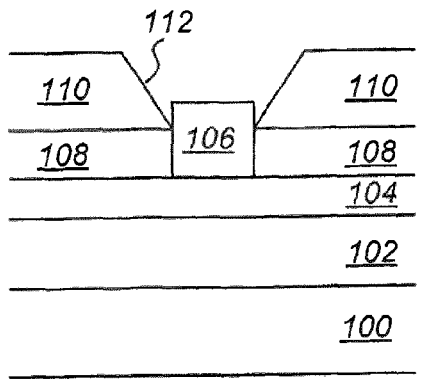

After the mask 106 has been provided on the channel layer 104, a contact layer 108 is epitaxially grown on the channel layer 104 (FIG. 1c). The contact layer 108 may be a heavily doped semiconductor. The mask 106 prevents the contact layer 108 from growing on the region of the channel layer 104 covered by the mask 106. After growing the contact layer 108, a support layer 110 is epitaxially grown on the contact layer 108. The contact layer 108 and the support layer 110 may be grown using molecular beam epitaxy (MBE) or metal-organic chemical vapor deposition (MOCVD), also known as metal-organic vapor phase epitaxy (MOVPE), on the channel layer 104.

By growing the contact layer 108 on the channel layer 104 an interface of relatively large area may be obtained between the contact layer 108 and the channel layer 104. The large interface enables an efficient transfer of charge carriers from the contact layer 108 to the channel layer 104. The channel layer 104 may be formed by an undoped semiconductor. An undoped semiconductor may present a low impurity concentration and thus a high mobility. Consequently, by growing the contact layer 108 on an undoped channel layer 104 an advantageously low series resistance between the contact layer 108 and the channel layer 104 may be obtained.

The relative lattice matching between the channel layer 104 and the contact layer 108 is such that the contact layer 108 may be epitaxially grown on the channel layer 104. Analogously, the relative lattice matching between the contact layer 108 and the support layer 110 is such that the support layer 110 may be epitaxially grown on the contact layer 108. The amount of acceptable mismatch is dependent on the thickness of the layer to be grown. For layers consisting of only a few monolayers, strained layers may be acceptable.

Numerous material combinations are possible for use in the process (for detailed examples see below). However, generally the combination of the contact layer 108 and the support layer 110 is chosen such that the support layer 110 may be etched at a higher rate than the contact layer 108. A suitable etchant may thus discriminate between the contact layer 108 and the support layer 110. In other words, the support layer 110 may be selectively etched from the contact layer 108.

As illustrated in FIG. 1c the thickness of the contact layer 108 and the support layer 110 may be such that the level of the top surface of the support layer 110 exceeds the level of the top surface of the mask 106. Alternatively, growth of the support layer 110 may be stopped when the top surface of the support layer 110 is flush with the top surface of the mask 106. Although not shown in FIG. 1c, also the thickness of the contact layer 108 may be such that the level of the top surface of the contact layer 108 exceeds the level of the top surface of the mask 106.

As illustrated in FIG. 1c the support layer 110 may be grown to present beveled facets 112 in the region close to the mask 106. The facets 112 may reduce the risk of overgrowing the mask 106. The facets 112 may be obtained by appropriate control of the growth conditions in the region of the mask 106 (e.g. by varying the pressure, the temperature, the ratio between the precursors during the growth, and/or by selecting different orientations of the mask 106 on the channel layer 104, etc). Optionally, also the contact layer 108 may be provided with beveled facets by appropriate control of the growth conditions.

Although, in the above and the following reference is made to a layer such as a channel layer, a contact layer, a support layer, an insulating layer etc it should be noted that each layer may be include one or more layer sections of different materials.

Figure 1D:
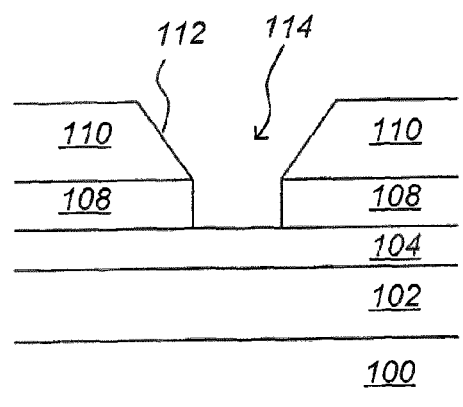

With reference to FIG. 1d, the mask 106 is removed wherein a trench 114 is formed. The trench 114 extends through the space previously occupied by the mask 106. The channel layer 104 forms the bottom of the trench 114. The trench 114 extends through the support layer 110. The trench 114 extends through the contact layer 108.

Figure 1E:
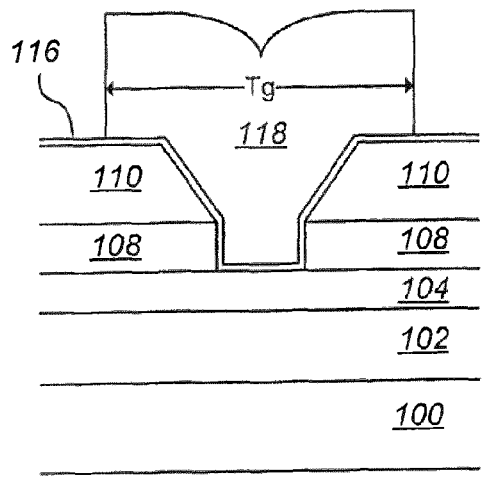

An insulating layer 116 is formed in the trench 114 (FIG. 1e). The insulating layer 116 may further cover the support layer 110. The insulating layer 116 may advantageously present a relatively high dielectric constant in order to enable a strong capacitive coupling to the channel layer 104. In other words the insulating layer 116 may be a high k material. The insulating layer 116 may include $Al_2O_3$, $HfO_2$ or $ZrO_2$. The insulating layer 116 may be formed by atomic layer deposition (ALD).

Following deposition of the insulating layer 116, a gate 118 is formed by depositing a conductor at the trench 114. The insulating layer 116 insulates the conductor 118 from the channel layer 104 and the contact layer 108. The conductor 118 may include a metal such as Ti, Pd or Au. The conductor 118 may be deposited e.g. using CVD, sputtering, evaporation, or ALD. The transverse dimension Tg (i.e. the dimension Tg of the gate 118 indicated in FIG. 1e) of the gate 118 outside the trench 114 may be defined as follows: A resist may be applied over the support layer 110. The transverse dimension Tg of the gate 118 may then be defined by irradiating a region of length Tg of the resist at the trench 114 wherein the resist in the irradiated region may be removed. Subsequently the conductor 118 is deposited over the support layer 110 and in the trench 114. The regions of the conductor 118 extending outside the region of width Tg may then be removed in a lift-off process. Alternatively, the conductor 118 may be deposited over the support layer 110 and in the trench 114. Then, the transverse dimension Tg of the gate 118 may be defined by irradiating desired portions of the conductor 118 (i.e. the portions inside the region of dimension Tg at the trench) in a lithography step. The final gate structure may then be formed by etching off the undesired portions (i.e. the non-irradiated portions) of the conductor 118.

Figure 1F:
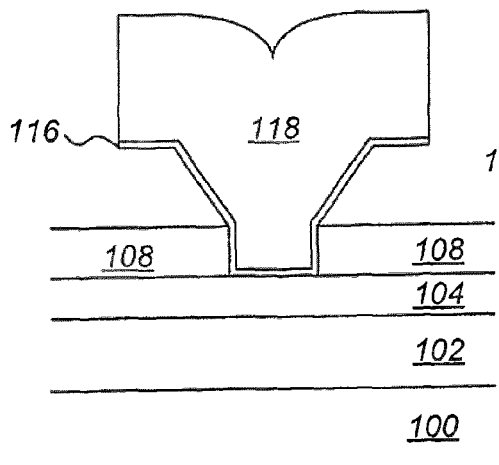

After the formation of the gate 118, the support layer 110 is removed by etching (FIG. 1f). The support layer 110 may be removed in a wet etch step, a dry etch step or a combination thereof. The removal of the support layer 110 may be preceded by a step of removing the insulating layer 116 from the support layer 110 in a region not covered by the gate 118. The insulating layer 116 may be removed by wet or dry etching.

Figure 1G:
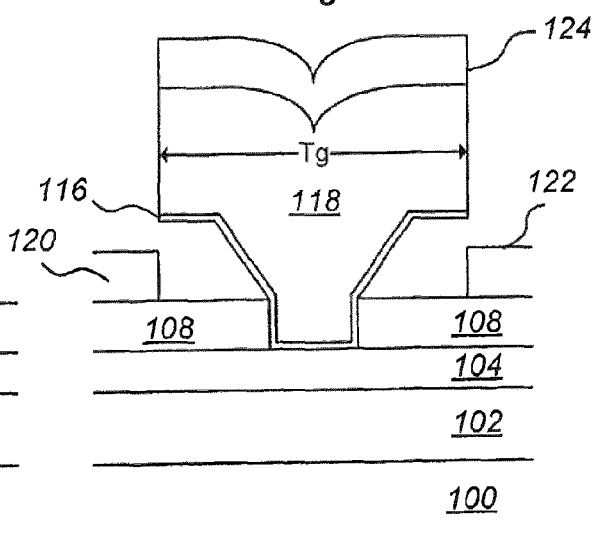

As shown in FIG. 1g, connections 120, 122 may then be arranged on the contact layer 108. The connections 120, 122 may thus form source and drain contacts, respectively, of the device. The connections 120, 122 may be formed by depositing a conductor on the contact layer 108. The conductor may include a metal such as Ti, Pd or Au. The conductor may be deposited by evaporation. The transverse dimension Tg of the gate 118 may exceed the transverse dimension of the trench 114 (i.e. the dimension of the trench 114 in a direction parallel with the dimension L). Hence, the gate 118 may project over, or shadow the contact layer 108. The gate 118 may thus be used as a shadow mask, limiting the extension of the connections 120, 122 towards the gate 118. During the deposition of the conductor a conductor layer 124 may form also on top of the gate 118 as illustrated in FIG. 1g.

In use of the finished device shown in FIG. 1g, a current may pass from the contact 120 to the channel layer 104 via the left part of the contact layer 108, and further to the contact 122 via the right part of the contact layer 108. The current thus flows within the plane of the channel layer 104. The magnitude of the current flowing through device may be controlled by a gate voltage applied to the gate 118. The gate 118 is capacitively coupled to the channel layer 104 via the insulating layer 116. The barrier layer 102 prevents formation of current paths below the channel layer 104, outside the control of the gate 118. By virtue of the process, the device may be provided with a relatively large gate conductor body wherein a gate resistance may be reduced. This may be advantageous in high frequency applications.

Figure 1H:
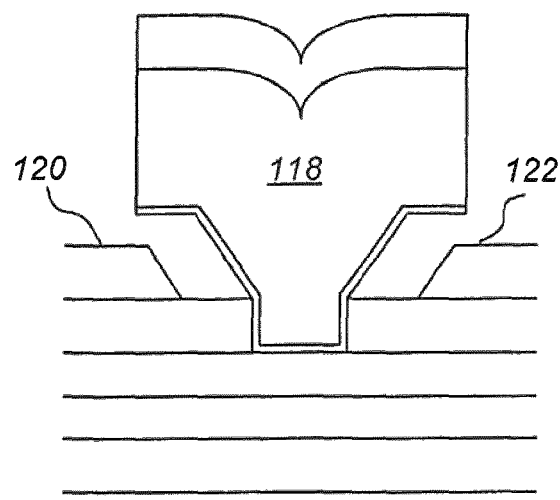
FIGS. 1h-k are schematic illustrations of variations of the first embodiment.

FIG. 1h illustrates a device according to an alternative design wherein the structure has been tilted during the evaporation step wherein the connections 120, 122 may be arranged below the overhang of the gate 118, at least partly, and thus closer to the trench. This may reduce the series resistance between the connections 120, 122 and the channel layer 104.

Figure 1I:
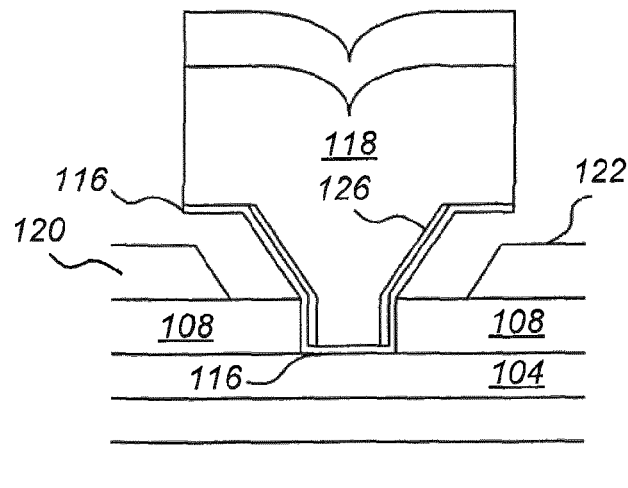

FIG. 1i illustrates a device according to yet another alternative design wherein the gate 118 has been provided with an additional insulating layer 126 presenting a lower dielectric constant than the insulating layer 116. The insulating layer 126 may be a low k material, such as $SiO_2$, $SiN_x$, $Si_3N_4$. The insulating layer 126 may be provided on the side walls of the trench prior to providing the gate 118 in the trench. The insulating layer 126 may be deposited in the trench after the insulating layer 116. The insulating layer 126 may then be removed at the bottom of the trench 114 using an anisotropic etch process. The insulating layer 126 is arranged on and in contact with the stem of the gate 118. However, no insulating layer 126 is arranged at the interface between the base of the gate 118 and the channel layer 104. Thereby a strong capacitive coupling between the gate 118 and the channel layer 104 may be obtained while a parasitic capacitive coupling between the gate 118 and the contact layer 108 and the gate 118 and the connections 120, 122 may be limited. Additionally, by forming the insulating layer 126 in this manner, the gate length may be reduced in a controlled manner by controlling the thickness of the insulating layer 126.

Figure 1J:
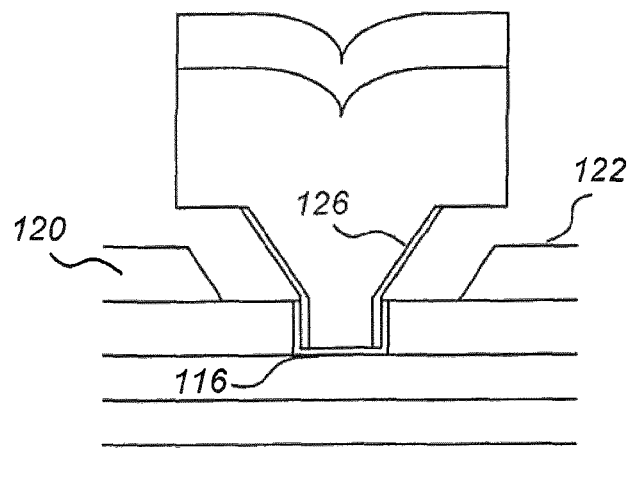

Optionally, portions of the insulating layer 116 outside the insulating layer 126 may be removed after the support layer 110 has been removed. A device manufactured according to this option is illustrated in FIG. 1j. By removing these portions of the high k insulating layer 116 the capacitive coupling between the gate 118 and the connections 120, 122, as well as the gate 118 and the contact layer 108 may be further reduced.

Figure 1K:
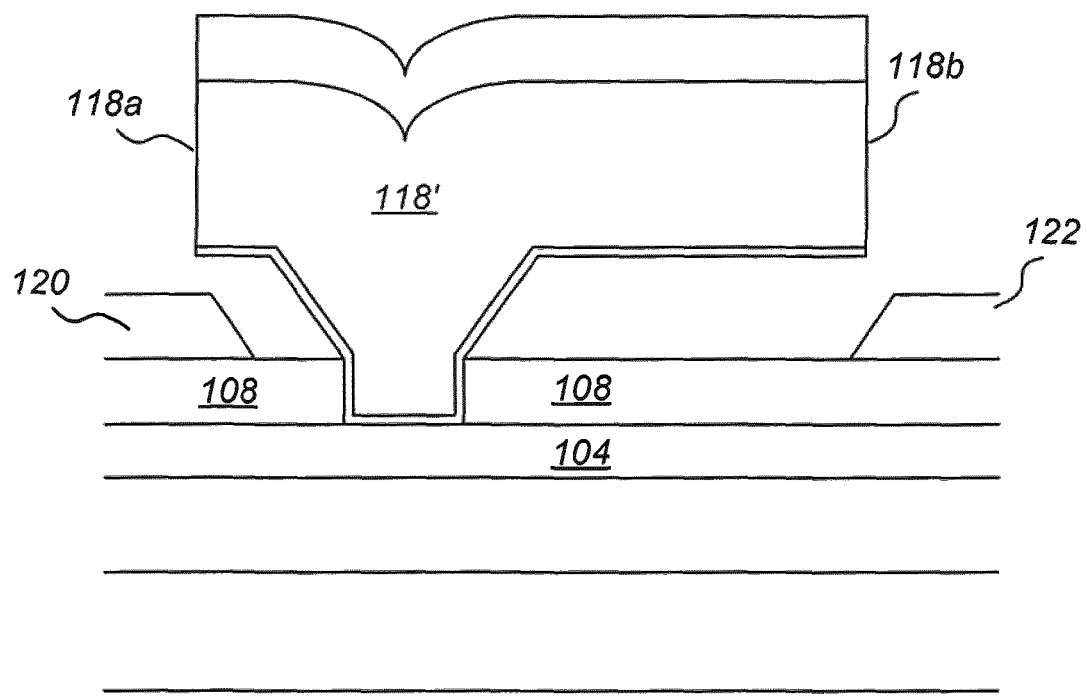

With reference to FIG. 1k, a conductor 118' may also be provided with an asymmetric design. For example a greater region of the conductor 118' may be removed at the source side than at the drain side (e.g. by lift-off or lithography and etching). The conductor 118' includes a first portion 118a and a second portion 118b. The first portion 118a overhangs a source region of the contact layer 108. The second portion 118b overhangs a drain region of the contact layer 108. The first and second portions 118a, 118b protrudes above the channel layer 108 in a direction away from the trench and perpendicular to the depth of the trench. The dimension of the protrusion of the second portion 118b exceeds the dimension of the protrusion of the first portion 118a. Thereby the drain connection 122 may be distanced from the active region of the channel layer 104 below the bottom of the trench while forming the source and drain connections 120, 122 in a self aligned manner with respect to the conductor 118'.

Figure 2A:
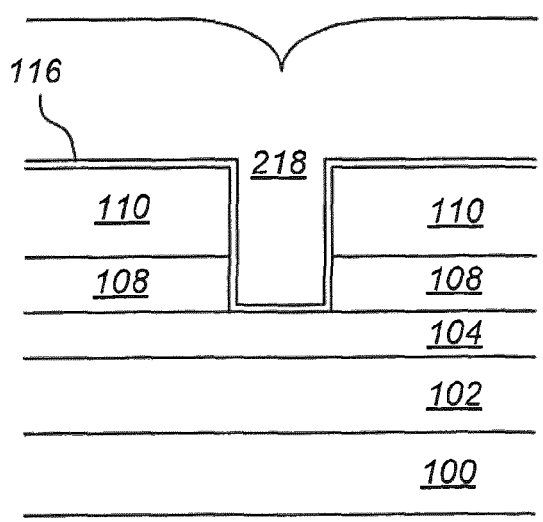
FIG. 2a-c are schematic illustrations of a process of a second embodiment.

A second embodiment of a process of manufacturing a semiconductor device will now be described with reference to FIGS. 2a-c which show cross sections of a structure taken along a cut in the structure corresponding to the cut A-A indicated in FIG. 1a.

The second embodiment is similar to the first embodiment however differs in that it includes a planarization step after the gate has been provided in the trench. More specifically, and as illustrated in FIG. 2a a trench is formed in accordance with the first embodiment but with vertical facets instead of the above-discussed beveled facets 112. However it should be noted that optionally the trench may be formed with beveled facets. An insulating layer 116 and a conductor 218 is arranged in the trench in accordance with the first embodiment in order to provide a gate 218 insulated from the channel layer 104. In this embodiment, a lithography step defining the dimension Tg of the gate 218 outside the trench may be omitted. Prior to the planarization the conductor 218 may thus cover the entire support layer 110.

Figure 2B:
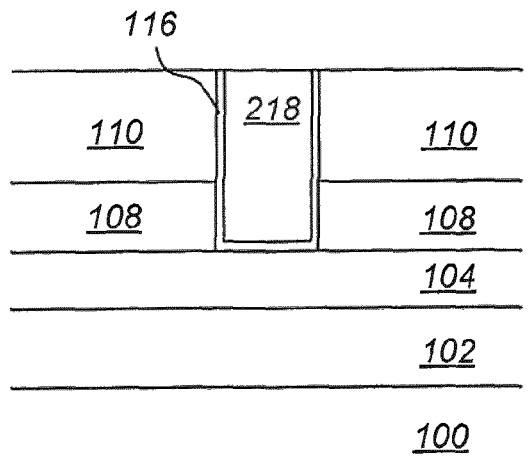
Figure 2C:
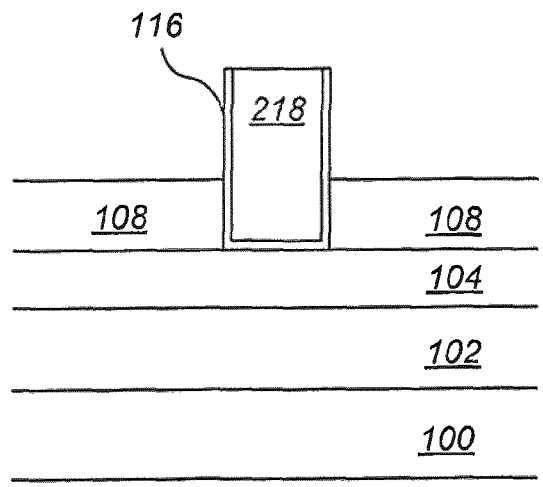

The process proceeds with removing the portions of the conductor 218 extending outside the trench (FIG. 2b). The portions may be removed in a planarization process including chemical-mechanical polishing, chemical etching, physical etching or a combination thereof. In the planarization process any portions of the insulating layer 116 covering the support layer 110 may also be removed. Alternatively, the insulating layer 116 may be removed in a separate etching step. The planarization results in a gate 218 having a top surface which is flush with the top surface of the support layer 110. Optionally, also the thickness of the support layer 110 may be reduced during the planarization.

The support layer 110 may then be removed in a manner completely analogously to that of the first embodiment by using an etch acting on the support layer 110 but not the contact layer 108. The resulting device is illustrated in FIG. 2c. Metallic source and drain contacts (not shown) may be provided on the contact layer 108 in accordance with the first embodiment. However, in this case the gate 218 does not shadow the contact layer 108. The various configurations of the insulating layers 116 and 126 discussed in connection with FIGS. 1i-j are applicable also to the second embodiment.

Compared to the device obtained in the first embodiment, the device obtained in the second embodiment may present gate conductor body of smaller volume and smaller length dimension. The device of the second embodiment may thus be advantageously used in digital circuits where small size is a critical design criterion.

A third embodiment of a process of manufacturing a semiconductor device will now be described with reference to FIGS. 3a-b which show cross sections of a structure taken along a cut in the structure corresponding to the cut A-A indicated in FIG. 1a.

Figure 3A:
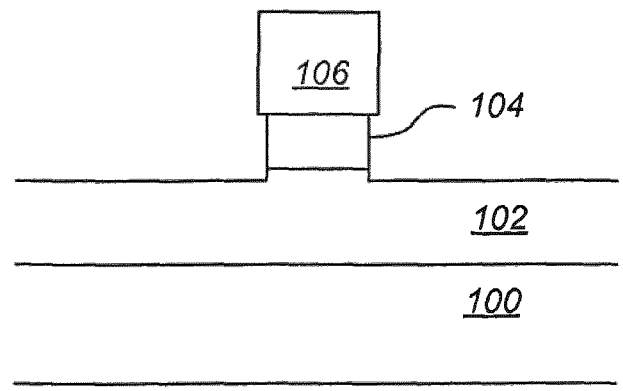
FIG. 3a-b are schematic illustrations of a process of a third embodiment.
Figure 3B:
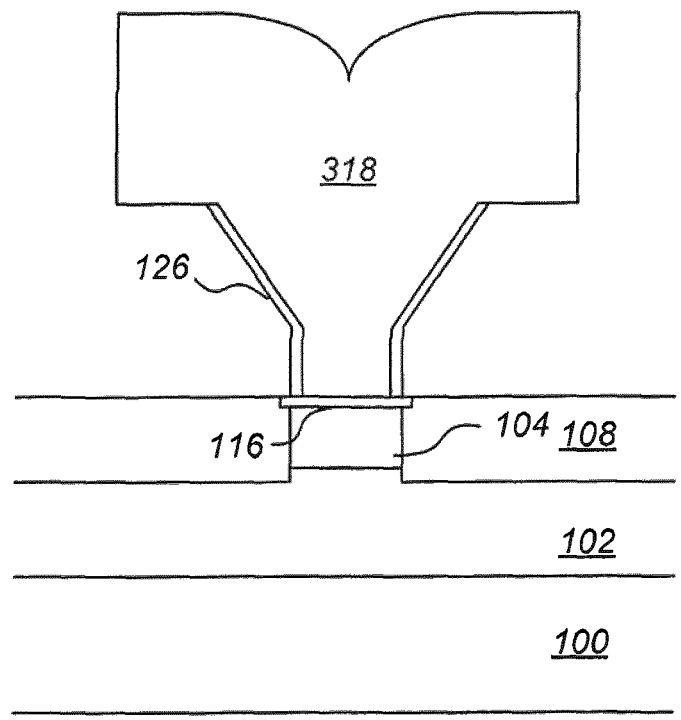

The third embodiment is similar to the first embodiment however differs in that the epitaxial growing of the contact layer and the support layer is preceded by removing the channel layer 104 in a region of the channel layer 104 not covered by the mask 106 (FIG. 3a). The region may be removed by etching wherein the mask 106 prevents etching of the region of the channel layer 104 covered by the mask 106.

As illustrated in FIG. 3a, the etching may undercut the mask 106. The amount of undercut may be controlled by adaption of the horizontal etch rate. During the etching step, also the barrier layer 102 may be partly etched, wherein the thickness of the barrier layer 102 may be reduced. To control the etch depth the barrier layer 102 may include an etch stop layer.

Following the etch step, the contact layer 108 is epitaxially grown on the barrier layer 102. The process then proceeds analogously to the process of the first embodiment by epitaxially growing a support layer, similar to the support layer 110 of the first embodiment, on the contact layer 108 and subsequently removing the mask 106, thereby forming a trench. Thereafter an insulating layer 116 and a gate 318 is provided in the trench. The support layer may then be etched off without removing the contact layer 108. A resulting device is illustrated in FIG. 3b. Similar to the first embodiment, connections corresponding to connections 120, 122, 124 may be provided on the contact layer 108. The sides of the gate 318 may be provided with the optional low k insulating layer 126 as previously described. The discussion in connection with FIGS. 1i-j regarding the various configurations of the insulating layers 116 and 126 is applicable also to the third embodiment.

Due to the initial etching of the channel layer 104 (and if applicable also the barrier layer 102), the contact layer 108 becomes submerged in the channel layer 104 (and if applicable also in the barrier layer 102). The contact layer 108 may thus overlap the channel layer 104 in the growth direction of the contact layer 108. By submerging the contact layer 108 in the channel layer 104 the series resistance between the source and drain regions of the contact layer 108 may be reduced. Furthermore, and as illustrated in FIG. 3b, the overlap between the contact layer 108 and the gate 318 in the growth direction of the contact layer 108 may be minimized. The capacitive coupling between the gate 318 and the contact layer 108 may thereby be reduced. This may be advantageous in high frequency applications wherein parasitic gate capacitances may cause losses. However, according to another design the contact layer 108 may be grown to a thickness such that the contact layer 108 overlaps the gate 318 partly in the growth direction. This may be preferable in some applications since it enables formation of a thicker contact layer 108 which may enable a reduced resistance in the channel layer 108.

Figure 4A:
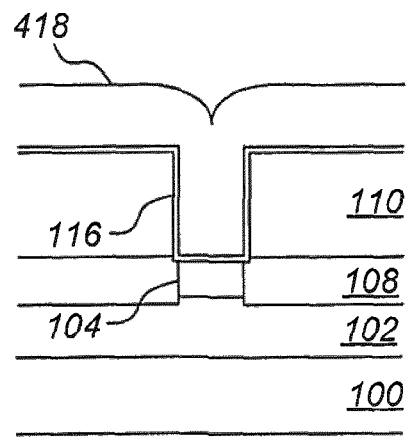
FIGS. 4a-c are schematic illustrations of a process of a fourth embodiment.

A fourth embodiment of a process of manufacturing a semiconductor device will now be described with reference to FIGS. 4a-c which show cross sections of the structure taken according to the cut A-A indicated in FIG. 1a.

The fourth embodiment is similar to the third embodiment however differs in that it includes a planarization step after the gate 418 has been provided in the trench. In this respect, the fourth embodiment is thus similar to the second embodiment. More specifically, and as illustrated in FIG. 4a a trench is formed in accordance with the third embodiment but with vertical facets instead of the above-discussed optional beveled facets 112. An insulating layer 116 and a conductor 418 is arranged in the trench in accordance with the third embodiment in order to provide a gate 418 insulated from the channel layer 104. In this embodiment, a lithography step defining the transverse dimension Tg of the gate 418 outside the trench may be omitted. Prior to the planarization, the conductor 418 may thus cover the entire support layer 110.

Figure 4B:
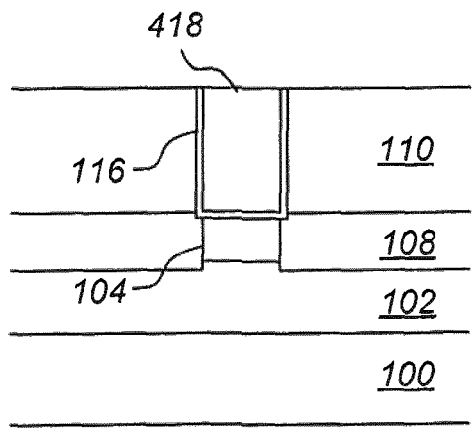

The process proceeds with removing the portions of the conductor 418 extending outside the trench (FIG. 4b). The portions may be removed in a planarization process including chemical-mechanical polishing, chemical etching, physical etching or a combination thereof. In the planarization process any portions of the insulating layer 116 covering the support layer 110 may also be removed. The planarization results in a gate 418 having a top surface which is flush with the top surface of the support layer 110.

The support layer 110 may then be removed in a manner completely analogous to that of the first, second and third embodiments by using an etch acting on the support layer 110 but not the contact layer 108. The resulting device is illustrated in FIG. 4c. Metallic source and drain contacts (not shown) may then be provided on the contact layer 108 in accordance with the first embodiment. The sides of the gate 418 may be provided with the optional low k insulating layer 126. The insulating layer 126 may be provided on the sides of the gate 418 after the support layer 110 has been removed and optionally after any portions of the high k insulating layer 116 has been removed from the sides of the gate 418. The thickness of the insulating layer 126 may be used to control the distance between the metallic source and drain contacts and the gate 418. The discussion in connection with FIGS. 1i-j regarding the various configurations of the insulating layers 116 and 126 is applicable also to the fourth embodiment.

Figure 4C:
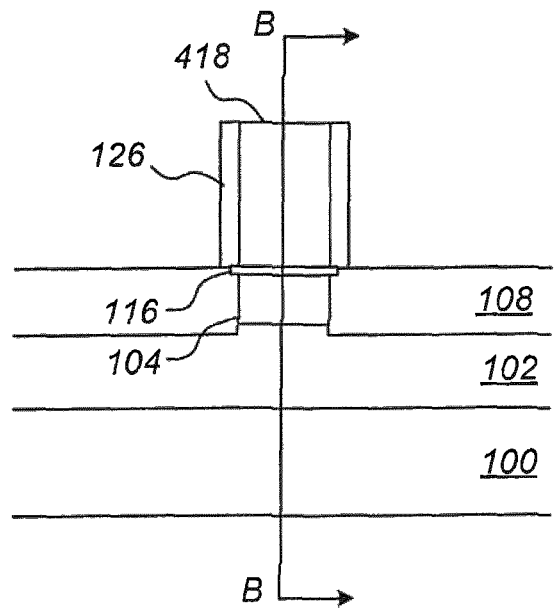

The device in FIG. 4c may present similar advantages as the device in FIG. 3c. However, due to the planarization of the conductor 418, the gate 418 may be formed to smaller dimensions than the gate 318. The device of the fourth embodiment may thus be advantageously used in digital circuits where small size is a critical design criterion.

According to the third and fourth embodiments, the contact layer 108 may be submerged into the channel layer 104 by etching the channel layer 104 in regions outside the mask 106. According to an alternative process, the channel layer 104 may have been regrown on selected regions of the barrier layer 102. A mask similar to the mask 106 may then be arranged on the regrown channel layer 104 wherein the process may proceed in complete analogy with the third and fourth embodiment however without the initial etching of the channel layer 104.

The above described embodiments may be used with a range of material combinations. According to one material combination, the base layer 100 may include InP. The barrier layer 102 may include $In_xAl_{1-x}As$, for example $In_{0.52}Al_{0.48}As$. The barrier layer 102 may be undoped. Alternatively, the barrier layer 102 may be slightly doped. This may improve the properties of the barrier layer 102 in some cases. The barrier layer 102 may include an etch stop layer of InP. The channel layer 104 may include $In_xGa_{1-x}As$, for example $In_{0.53}Ga_{0.47}As$. The channel layer 104 may be undoped. The contact layer 108 may include $In_xGa_{1-x}As$, for example $In_{0.53}Ga_{0.47}As$. The growth temperature for the contact layer 108 and the support layer 110 may be approximately 500° C. The contact layer 108 may be grown using trimethylgallium (TMGa), trimethylIndium (TMIn) and arsine ($AsH_3$) as precursors. The growth may be initiated by introducing these precursors at molar fractions of 3.0 E-5, 7.79 E-5 and 1.15 E-2 for TMGa, TMIn and $AsH_3$, respectively. The contact layer 108 may be heavily n-doped. The doping may be obtained by flowing tetraethyltin while growing the contact layer 108. A tetraethyltin (TESn) molar fraction may be 1.2 E-5, giving a Sn/III ratio of 0.11. The support layer 110 may include InP. For the InP growth the precursors TMIn and phosphine (PH3) may be used. For example, molar fractions of approximately 1.1 E-4 and 1.9 E-2 for TMIn and PH3, respectively, may be used. The support layer 110 may be removed using a wet etch including $HCl:H_2O$. The insulating layer 116 may include $Al_2O_3$ and/or $HfO_2$. The insulating layer 116 may be removed using a BOE 10:1 dry etch. However, the insulating layer 116 may also include $Ta_2O_5$, $Al_2O_3$, $La_2O_3$, $TiO_2$, HfO2, $ZrO_2$, BeO, BaO, $Y_2O_3$, $Lu_2O_3$, MgO, SrO, $SiO_2$, $Si_3N_4$ or alloys or combinations thereof. The insulating layer 126 may include $Si_3N_4$. The insulating layer 126 may be removed with a fluoride based dry-etch. As mentioned above the mask 106 may be a $SiO_2$ mask. The mask 106 may be removed using an HF containing etch solution.

It should be noted that this only constitutes one example of materials and process parameters that may be used in the inventive process and that other combinations and process parameters are possible within the scope of the invention as defined solely by the scope of the appended claims. For example, the base layer 100 may include GaAs and $Al_xGa_{1-x}Sb$. The barrier layer 102 may include $Al_xAs_{1-x}Sb$. The channel layer 104 may include InAs. The contact layer 108 may include InAs. The support layer 110 may include $Al_xAs_{1-x}Sb$. The support layer 110 may be removed using a wet etch including HF or HCl. According to yet another example, the base layer 100 may include GaAs. The barrier layer may include $Al_xAs_{1-x}Sb$ or $Al_xGa_{1-x}Sb$. The channel layer 104 may include GaSb. The channel layer 104 may be undoped. The contact layer 108 may include GaSb. The contact layer 108 may be heavily doped. The support layer 110 may include InAs. The support layer 110 may be removed using a wet etch including citric acid and $H_2O_2$. According to yet another example, the base layer 100 may include a substrate layer and a buffer layer. The barrier layer 102 may be grown on the buffer layer. The substrate layer may include Si wherein the buffer layer may allow a barrier layer 102 of $In_xAl_{1-x}As$, $Al_xAs_{1-x}Sb$ or $Al_xGa_{1-x}Sb$ to be formed on the base layer 100.

For any of the material combinations given above, the gate 118, 218, 318, 418 and the connection layers 120, 122, 124 may include a conductor or an alloy of conductors having a work function in the range of 3.1 to 5.4 eV. For example, the conductor or the alloy may include Ti, Pd and Au.

In a variation of the above-described embodiments the contact layer 108 may be epitaxially grown while varying at least one parameter. The at least one parameter to be varied may include a doping concentration or a band gap. This may provide additional freedom when designing the device. For example, the contact layer 108 may be epitaxially grown while varying a doping concentration of the contact layer 108 from a first concentration to a second concentration which is higher than the first concentration, and/or while varying a band gap of the contact layer 108 from a first value to a second value which is smaller than the first band gap. The band gap may be varied by varying a material composition of the contact layer 108. A finished contact layer 108 may thus include a first section arranged closer to the channel layer 104 than a second section and including a material having a lower concentration of dopants and/or having a larger band gap than the material of the second section arranged at a greater distance from the channel layer 104. This enables parasitic effects in regions of the contact layer 108 and/or channel layer 104 near the conductor 118, 218, 318, 418 to be reduced. According to one example, the channel layer may include $In_{0.53}Ga_{0.47}As$. The contact layer 108 may include, along the growth direction of the channel layer 108, a first section of $In_{0.53}Ga_{0.47}As$, a second section of linearly graded $In_xGa_{1-x}As$, x=0.53 to 1.00, and a third section of InAs. The support layer 110 may include 90 nm of InP. The doping concentrations of the first, second and third sections may for example be within the ranges 2 E16 to 5 E18 $cm^{-3}$, 2 E16 to 6 E19 $cm^{-3}$, and 1 E19 to 6 E19 $cm^{-3}$, respectively. The first section may for example have a thickness of 5-100 nm. The second section may for example have a thickness of 1-20 nm. The third section may for example have a thickness of 1-20 nm. These values are only provided as examples and further material compositions and doping concentrations are possible as will be understood by those skilled in the art based on this example.

Although, in the above, process embodiments have been described in connection with a MISFET, the inventive concept is not limited to this specific type of FET but is more generally applicable to other types of FET structures. For example a High Electron Mobility Transistor (HEMT) may be manufactured by providing an upper layer of the channel layer, the upper layer including a semiconductor interface layer. The gate (e.g. gate 118, 218, 318 or 418) may be arranged in contact with the upper semiconductor interface layer. The HEMT need not include an insulating layer (e.g. layer 116) between the gate (e.g. 118, 218, 318 or 418) and the channel layer (e.g. layer 108). Instead the semiconductor interface layer acts as a barrier between the gate and the active (i.e. conducting) part of the channel layer. An insulating layer, such as the insulating layer 126, may be provided between the gate (e.g. 118, 218, 318 or 418) and the contact layer (e.g. layer 108). Alternatively, both an insulating layer (e.g. layer 116) and a semiconductor interface layer may be provided. The insulating layer may thus be arranged between and in contact with the gate and the semiconductor interface layer of the channel layer. Such a device may be referred to as a MISHEMT.

Figure 5:
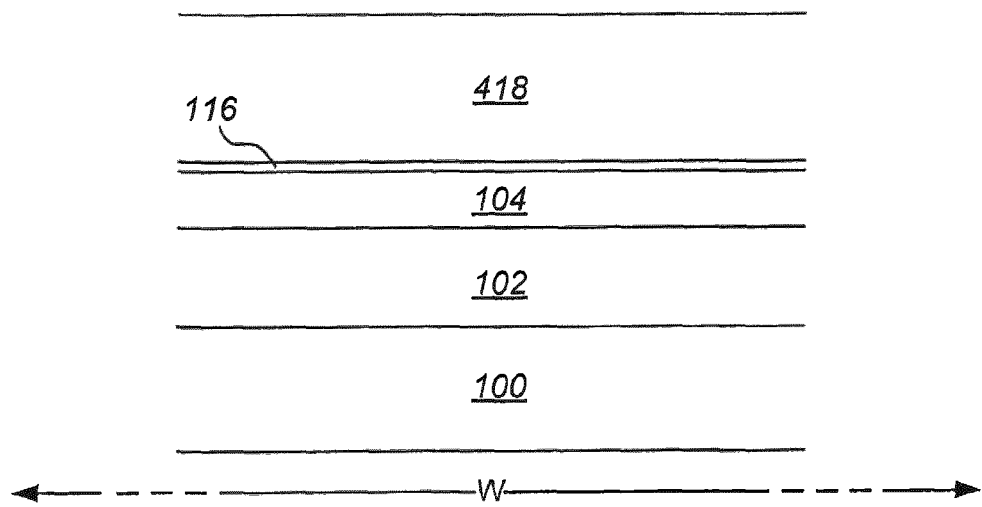
FIG. 5 schematically illustrates one design of a manufactured device.

The above described embodiments may be used for manufacturing devices presenting lateral current conduction (sometimes also referred to as planar conducting devices) of various designs. FIG. 5 shows a cross section of a device of one possible design. The cross section extends through a vertical centerline of the gate 418 as indicated by the cut B-B in FIG. 4c. However, the cross section of FIG. 5 is applicable also for the devices shown in FIGS. 1f, 2c and 3b. The design may be obtained by defining the mask 106 to extend along the entire width dimension W of the base layer 100 (i.e. dimension W indicated in FIG. 1a).

Figure 6:
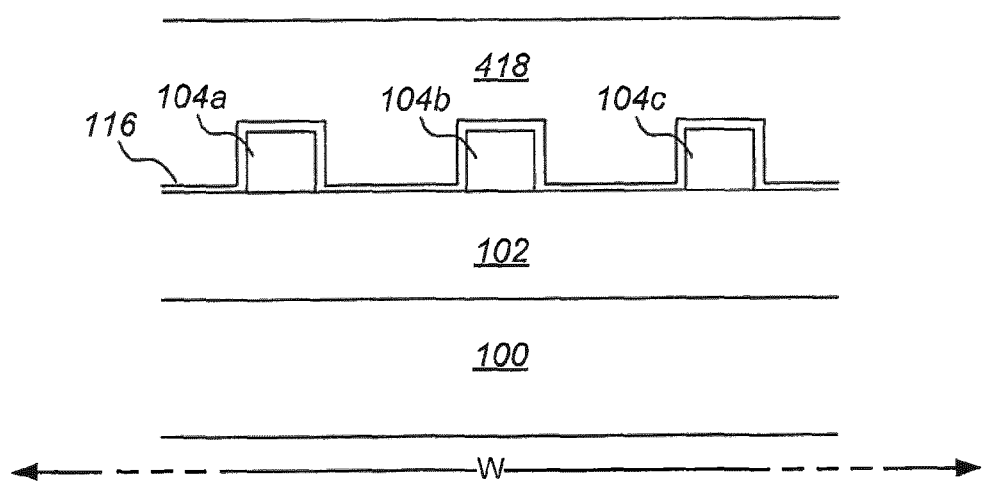
FIG. 6 schematically illustrates another design of a manufactured device.

FIG. 6 shows a cross section of a device according to another possible design including three channel layer members 104a, 104b, 104c. The cross section of this device is also taken as indicated by the cut B-B in FIG. 4c. The cross section shown in FIG. 4c may represent a cut taken through either one of the channel layer members 104a, 104b, 104c. The transistor of FIG. 6 is sometimes referred to as a tri-gate or FinFET transistor. The design may be obtained by forming a mask including one or more mask portions (e.g. a hard mask formed from HSQ) on the barrier layer 102 wherein channel layer members 104a, 104b, 104c of a desired thickness may be regrown on the regions of the barrier layer 102 not covered by the mask. Alternatively the design may be obtained by defining a mask including a number of mask portions on the channel layer 104 and reducing the thickness of the channel layer 104 in regions thereof which not are covered by said mask portions, e.g. by etching. The regions of the channel layer 104 not covered by the mask portions may be completely removed. The number of channel layer members shown in FIG. 6 is only an example and fewer or more channel layer members may be provided. The mask, i.e. the mask portions, may be defined in the same manner and include the same materials as the mask 106.

A mask 106 (e.g. the mask used in the third or fourth embodiment) may be provided on the channel layer members 104a, 104b, 104c wherein regions of the channel layer members 104, 104b, 104c extending outside the mask 106 may be removed by etching as discussed in the third and fourth embodiment. The process may then proceed in complete analogy with the third or fourth embodiments starting with growing the contact layer 108 on the barrier layer 102.

The tri-gate or FinFET structure may also be obtained using the process of the first and second embodiments. Channel layer members similar to the channel layer members 104a, 104b, 104c may be provided on the barrier layer 102 by in an etching or regrowth process as described in the above. The channel layer members may extend along the entire length of the base layer 100 (i.e. dimension L indicated in FIG. 1a). The process may then proceed in complete analogy with the first or second embodiments, starting with providing the mask 106 on the channel layer members and then growing the contact layer 108 in the regions of the channel layer members not covered by the mask 106 as well as in the regions of the barrier layer 102 covered by neither the channel layer members 104a, 104b, 104c nor the mask 106.

According to a further alternative, channel layer members similar to the channel layer members 104a, 104b, 104c may be formed in a separate process and then transferred to the surface of the barrier layer 102. The channel layer members may e.g. be formed as thin semiconductor membranes or as semiconductor wires. The process may then proceed in complete analogy with any of the first to fourth embodiments.

Figure 7A:
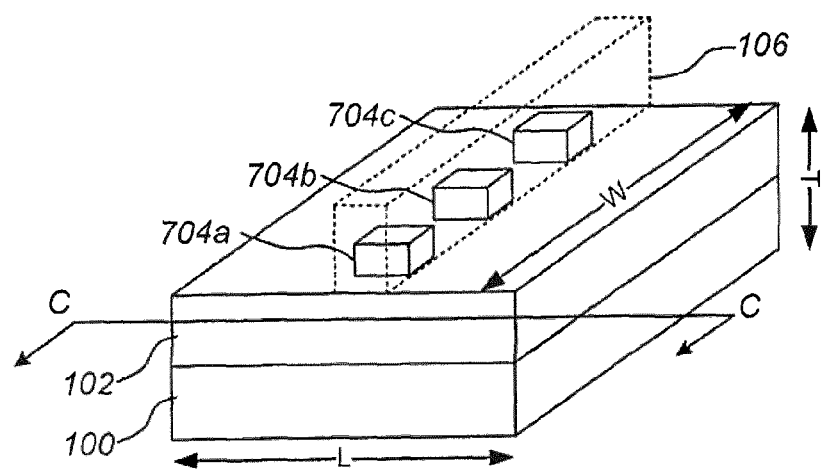
FIGS. 7a-c are schematic illustrations of a process according to a fifth embodiment.

A process according to a fifth embodiment will now be described with reference to FIGS. 7a-c. A channel layer including a plurality of channel layer members 704a, 704b, 704c (In FIG. 7a three members are shown, however fewer or more members may be provided) are provided on a barrier layer 102 which is arranged on a base layer 100. The base layer may e.g. include GaAs and $Al_xGa_{1-x}Sb$. The barrier layer 104 may include $Al_xAs_{1-x}Sb$. The channel layer members 704a, 704b, 704c may include InAs. The channel layer members 704a, 704b, 704c may be undoped. The channel layer members 704a, 704b, 704c may be provided by removing regions of a channel layer from the barrier layer 102. An etch mask may be provided on the channel layer wherein portions not covered by the etch mask may be etched off, the remaining regions forming the channel layer members 704a, 704b, 704c. Alternatively, the channel layer members 704a, 704b, 704c may be formed in a separate process and then transferred to the surface of the barrier layer. The channel layer members may e.g. be formed as thin semiconductor membranes or as semiconductor wires. In FIG. 7a the channel layer members only extend partly over the length L of the base layer 100. However, the channel layer members may also extend along the full length L of the base layer.

Next a mask 106 (e.g. similar to the mask 106 of the first to fourth embodiment) is provided over the channel layer members 704a, 704b, 704c. The mask may be formed in any of the ways described in connection with the first embodiment. The process may then proceed by growing the contact layer 108 and the support layer 110 in the regions not covered by the mask 106. The contact layer 108 may thus be grown on the barrier layer 102 in analogy with the third and fourth embodiment. Alternatively, the mask 106 need not completely cover the channel layer members 704a, 704b, 704c (for example if the channel layer members extend along the full length L of the base layer). In other words the dimension of the mask 106 may be less than the length of the channel layer members 704a, 704b, 704c. The contact layer 108 may then be grown in the regions of the channel layer members 704, 704b, 704c not covered by the mask 106 as well as in the regions of the barrier layer 102 covered by neither the channel layer members 704a, 704b, 704c nor the mask 106.

The contact layer 108 may include InAs. The contact layer 108 may be heavily doped. The support layer 110 may include $Ga_xAs_{1-x}Sb$. Following the growing of the support layer 110, the mask 106 is removed e.g. by etching wherein a trench, hereinafter referred to as the intermediate trench, extending through the support layer 110 and the contact layer 108 is formed. The bottom of the intermediate trench is alternately formed by the top surface of a channel layer member 704a, 704b, 704c and the regions of the barrier layer 102 connecting the channel layer members 704a, 704b, 704c.

Next a wet etch is applied in the trench. The wet etch may be etch selective such that the barrier layer 102 may be etched without etching the channel layer members 704a, 704b, 704c, the contact layer 108 and the support layer 110 appreciably. The combination of the barrier layer 102, the channel layer members 704a, 704b, 704c and the contact layer 108 may hence be chosen such that the barrier layer 102 may be etched at a higher rate than the others. A suitable etchant may thus discriminate between the material of the barrier layer 102 and the materials of the channel layer members 704a, 704b, 704c and the contact layer 108. For the barrier layer 102 including $Al_xAs_{1-x}Sb$ and the channel layer members 704a, 704b, 704c and the contact layer 108 including InAs, a wet etch including HF may be used.

As a result of the etching of the barrier layer 102, the depth of the intermediate trench is increased to form a final trench extending beneath the channel layer members 704a, 704b, 704c. The final trench may extend through the full thickness of the barrier layer 102 to the base layer 100.

Next, an insulating layer 716 may be provided in the final trench and optionally over the support layer 110 outside the final trench. The insulating layer 716 may be deposited in an ALD step. The insulating layer 716 may cover the base layer 100 on the bottom of the final trench. The insulating layer 716 may cover the facets of the barrier layer 102 defining the dimension of the lower portion of the final trench. The insulating layer 716 may further cover the free surfaces of the channel layer members 704a, 704b, 704c within the trench.

Subsequently, the final trench may be filled with a conductor in order to form a gate 718. The gate 718 may include similar materials as the gates 118, 218, 318, 418. Thereafter the support layer 110 may be removed by in a selective etching step not affecting the contact layer 108 appreciably. For a support layer 110 including GaSb and a contact layer 108 including InAs, the selective etching may be performed using a wet etch including $NH_4OH$.

Figure 7B:
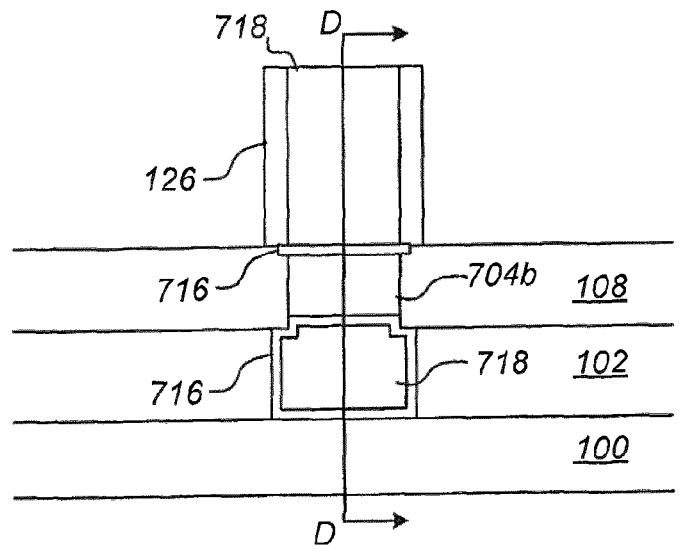

The resulting structure is illustrated in the cross sectional view FIG. 7b, the cut of which extends through the channel layer member 704b as indicated by cut C-C in FIG. 7a. Cuts through the channel layer members 704a and 704c may result in similar cross sections. After removing the support layer 110, the sides of the gate 718 may be provided with a low k insulating layer 126 similar to the insulating layer 126 discussed in connection with the first to fourth embodiments. Optionally, any portions of the insulating layer 716 covering the sides of the gate 718 extending above the contact layer 108 may be removed prior to providing the insulating layer 126.

Figure 7C:
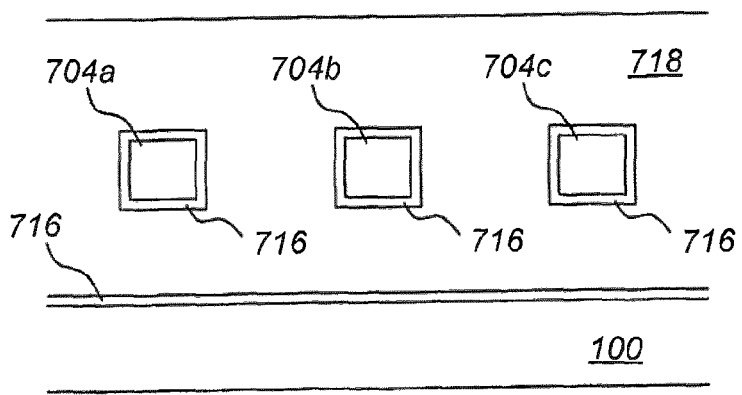

FIG. 7c illustrates another cross section of the structure shown in FIG. 7b. The cross section of FIG. 7c extends through a vertical centerline of the channel layer member 104b as indicated by the cut D-D in FIG. 7c. As illustrated in FIG. 7c, the gate 718 surrounds the channel layer members 104a, 104b, 104c. The channel layer members 704a, 704b, 704c are insulated from the gate 718 by the insulating layer 716. The gate 718 thus forms a wrap-around-gate. In the detailed embodiments described above with reference to the drawings, the trench (e.g. the trench 114) is formed by selective area epitaxial growth of a contact layer and a support layer. According to another aspect the trench may be formed by etching of a support layer and a contact layer. More specifically there is provided a process of manufacturing a semiconductor device comprising: providing a support layer on a semiconductor contact layer, the contact layer being arranged on a semiconductor channel layer, wherein the support layer is arranged to be etched at a higher rate than the contact layer; forming a trench extending through the support layer and the contact layer to the channel layer by etching off support layer material and contact layer material; and providing a conductor in the trench.

The conductor may be insulated from the channel layer. The conductor may also be insulated from the contact layer. The support layer may be a semiconductor material having a relative lattice matching such that the support layer may be epitaxially grown on the contact layer. Alternatively the support layer may be a dielectric. The support layer may be deposited on the contact layer using CVD or a spin-on technique. A planarization process, such as a chemical-mechanical polishing process, may then be applied to the support layer. An etch mask defining the trench may be formed on the support layer. An anisotropic etch may then be used to form a trench extending to the channel layer. The channel layer thus forms the bottom of the trench. Once the trench has been formed, the process may proceed in analogy with the process of the first or second embodiments.

The above-described processes for manufacturing a transistor may advantageously be supplemented by additional manufacturing steps enabling formation of a combination of a transistor and a resonant tunneling diode (RTD) on a single substrate. An embodiment of this extended process will now be described with reference to FIGS. 8a-f. The process will be described with reference to the $In_xGa_{1-x}As/InP$ material system but may be used also with other group III/V material combinations such as InAs/AlSb. In the following the process will be described in connection with manufacturing of a transistor in accordance with the first embodiment. However, also the processes of any of the second to fifth embodiments may be supplemented with additional manufacturing steps to enable formation of a transistor and an RTD on a single substrate.

Figure 8A:
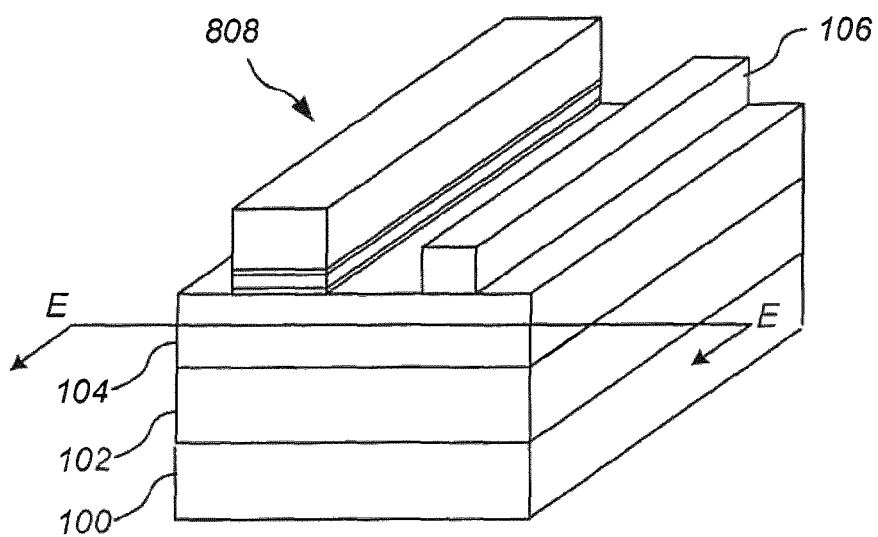
FIGS. 8a-f are schematic illustrations of a process for manufacturing a transistor and an RTD on a single substrate according to an embodiment.

FIG. 8a illustrates a structure including a base layer 100, a barrier layer 102, and a channel layer 104. The layers 102, 104 may include semiconductor material and may have been epitaxially grown on the base layer 100. The base layer 100 may include InP. The barrier layer 102 may 10 include $In_xAl_{1-x}As$ (for example $In_{0.52}Al_{0.48}As$). The channel layer 104 may include $In_xGa_{1-x}As$ (for example $In_{0.53}Ga_{0.47}As$). The channel layer 104 may be undoped. On the channel layer 104 a mesa 808 is provided. After providing the mesa 808 a mask 106 is provided on the channel layer 104. The mask 106 may be similar to the mask 106 of the first embodiment.

Figure 8B:
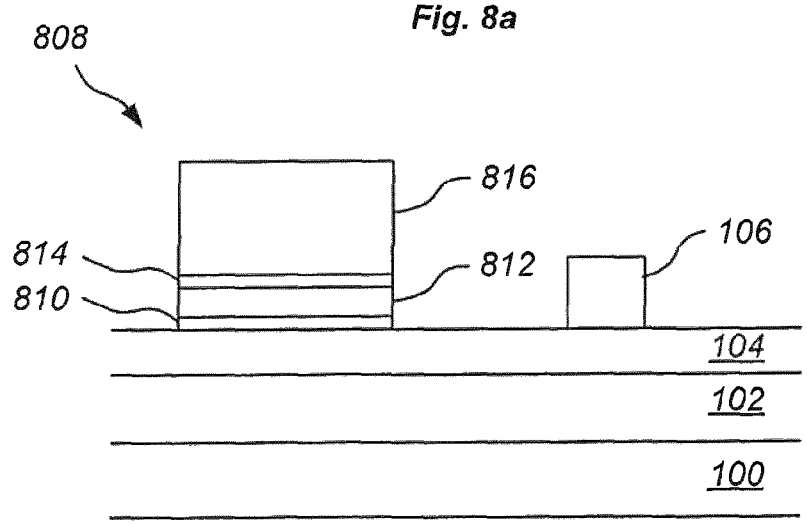

FIG. 8b is a cross sectional view of the structure in FIG. 8a. The cut is taken as indicated by the cut E-E. The mesa 808 may include a first etch stop layer 810. The etch stop layer 810 may include InP. The mesa 808 may include a RTD contact layer 812. The RTD contact layer 812 may include $In_xGa_{1-x}As$ (for example $In_{0.53}Ga_{0.47}As$). The mesa 808 may include a second etch stop layer 814. The etch stop layer 814 may include InP. The mesa 808 may include a resonant tunneling diode structure 816 (RTD). The RTD 816 may be realized by a double barrier heterostructure arranged in for example $In_xGa_{1-x}As$ and AlAs.

The layers 102, 104 and the mesa 808 include one or more sub-layers of semiconductor material and may have been epitaxially grown on the base layer 100. The mesa 808 may be formed by etching off undesired portions of the layers forming the mesa 808 from the channel layer 104 using conventional etching procedures wherein the first etch stop layer 810 prevents etching of the channel layer 104.

Figure 8C:
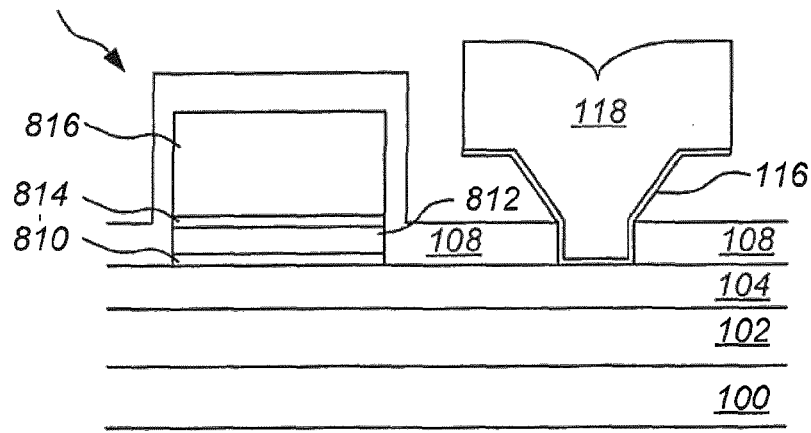

The process may proceed in analogy with the process of the first embodiment by growing a contact layer 108 in regions not covered by the mask 106. The contact layer 108 thereby covering the channel layer 104 and the mesa 808. Subsequently a support layer 110 may be epitaxially grown on the contact layer 108. After removing (e.g. by etching) the mask 106 a trench is formed which may be provided with an insulating layer 116 and filled with a conductor forming a gate 118. The support layer 110 may then be selectively etched off the contact layer 108. The resulting structure is illustrated in FIG. 8c.

Figure 8D:
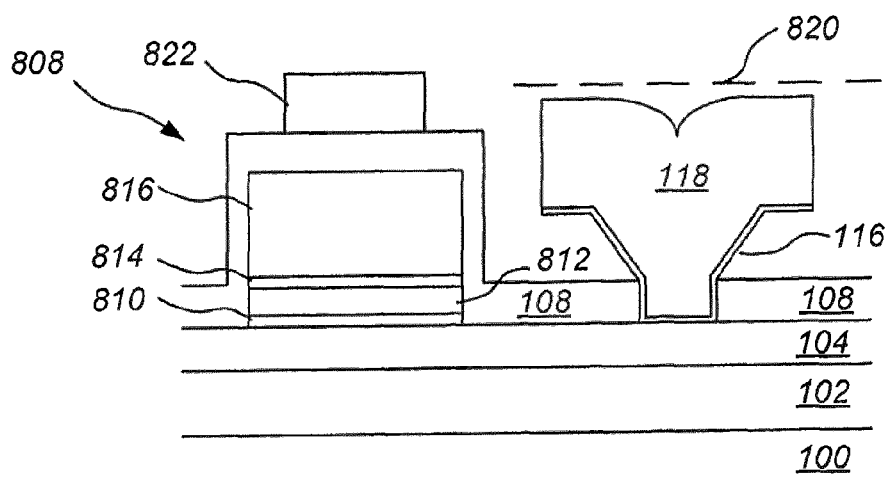

In FIG. 8d a mask 822 has been provided on the mesa 808. More specifically, the mask 822 has been provided on a portion of the contact layer 108 arranged on the mesa 808. The mask 822 may include a conductor, e.g.

a metal such as Ti, Pd, Au or a combination thereof. Moreover an etch resist layer (schematically indicated by dashed line 820) is applied over the transistor part of the structure, i.e. over the gate and surrounding portions of the contact layer 108.

Figure 8E:
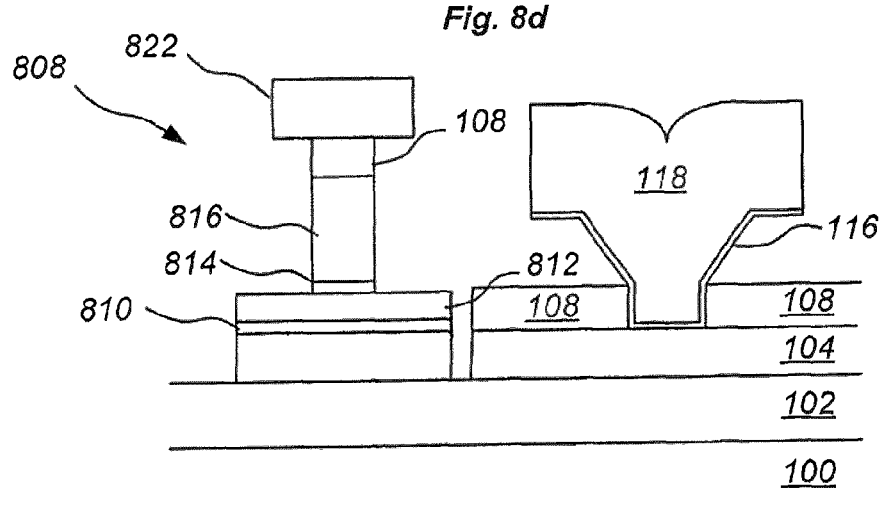

Next the contact layer 108 is removed such that the region of the contact layer 108 at the RTD is disconnected from the region of the contact layer 108 at the transistor, i.e. at the gate 818 (FIG. 8e). More specifically, regions of the structure not covered by either the etch resist 820 or the mask 822 may be removed. The contact layer 108 may be removed by etching wherein the mask 822 prevents etching of the regions of the contact layer 108 not covered by the mask 822. The etch may include citric acid and $H_2O_2$, or $H_2O_2$ and $H_3PO_4$. The etching may further result in thinning of the RTD 816. The second etch stop layer 814 may prevent etching of the RTD contact layer 812. As indicated in FIG. 8e underetching of the RTD may occur below the etch mask 822. Subsequently the etch stop layer 814 may be removed in a selective wet etch step. The etch may e.g. include HCl.

Figure 8F:
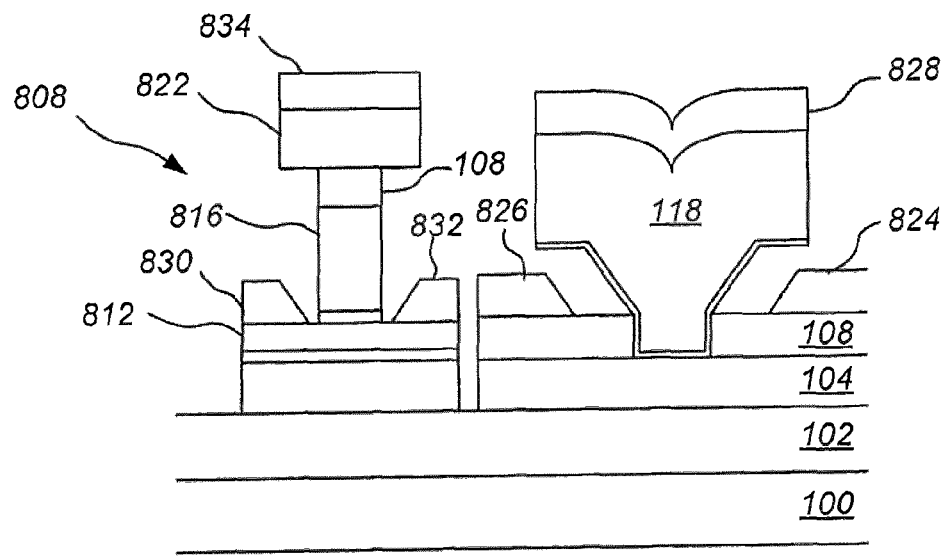

Thereafter a connection layer may be deposited on the structure to form contacts. The connection layer may be provided using the gate 818 and the conducting mask 822 as shadow masks. FIG. 8f illustrates the resulting structure including source and drain contacts 824, 826 on the contact layer 108 at the gate 818. During the deposition a connection layer 828 may form on top of the gate 118. Contacts 830, 832 are provided on the RTD contact layer 812. During the deposition a connection layer 834 may also form on the mask 822.

In the above embodiment, the formation of one transistor and one RTD has been described. However, a similar process may be used to form more than one transistor and more than one RTD on a single substrate.

In the above aspects of the invention has mainly been described with reference to a limited number of examples. However, as is readily appreciated by a person skilled in the art, other examples than the ones disclosed above are equally possible within the scope of the invention, as defined by the appended claims.

The invention claimed is:

1. A process for manufacturing a semiconductor device, comprising:
providing a channel layer,
providing a mask on the channel layer,
epitaxially growing a contact layer in contact with the channel layer,
epitaxially growing a support layer on the contact layer, wherein the support layer is arranged to be etched at a higher rate than the contact layer,
forming a trench extending through the support layer by removing the mask,
providing a conductor in the trench, and
removing the support layer by etching.

2. A process according to claim 1, wherein the support layer is grown such that the trench presents an increasing dimension along a growth direction of the support layer.

3. A process according to claim 1, wherein the support layer is grown such that the support layer extends beyond the mask in a growth direction of the support layer.

4. A process according to claim 1, wherein the contact layer is grown on the channel layer.

5. A process according to claim 1, further comprising:
providing a barrier layer, on which the channel layer is provided, and
epitaxially growing the contact layer on a surface of the barrier layer not covered by the channel layer.

6. A process according to claim 5, wherein growing the contact layer on the barrier layer comprises growing the contact layer to a thickness such that the contact layer does not overlap the conductor in a growth direction of the contact layer.

7. A process according to claim 1, further comprising providing a first insulating layer on the channel layer in the trench prior to providing the conductor in the trench.

8. A process according to claim 7, further comprising providing the conductor with a second insulating layer, the second insulating layer having a lower dielectric constant than the first insulating layer.

9. A process according to claim 1, further comprising providing a connection layer on the contact layer by metallization wherein the conductor is used as a shadow mask.

10. A process according to claim 1, wherein providing the conductor in the trench further comprises filling the trench with the conductor such that the conductor extends outside the trench.

11. A process according to claim 10, further comprising removing portions of the conductor extending outside the trench.

12. A process according to claim 1, wherein the mask on the channel layer is formed from HSQ.

13. A process according to claim 1, wherein the channel layer is provided on a substrate on which a resonant tunneling structure is arranged.

14. A process according to claim 2, wherein the support layer is grown such that the support layer extends beyond the mask in a growth direction of the support layer.

15. A process according to claim 2, wherein the contact layer is grown on the channel layer.

16. A process according to claim 2, further comprising:
providing a barrier layer, on which the channel layer is provided, and
epitaxially growing the contact layer on a surface of the barrier layer not covered by the channel layer.

17. A process according to claim 16, wherein growing the contact layer on the barrier layer comprises growing the contact layer to a thickness such that the contact layer does not overlap the conductor in a growth direction of the contact layer.

18. A process according to claim 2, further comprising providing a first insulating layer on the channel layer in the trench prior to providing the conductor in the trench.

19. A process for manufacturing a semiconductor device, comprising:
providing a barrier layer, on which a channel layer is provided,
providing a mask on the channel layer,
epitaxially growing a contact layer on a surface of the barrier layer not covered by the channel layer, wherein the contact layer is grown in contact with the channel layer,
epitaxially growing a support layer on the contact layer, wherein the support layer is arranged to be etched at a higher rate than the contact layer,
forming a trench extending through the support layer by removing the mask, and
providing a conductor in the trench.

20. A process according to claim 19, wherein growing the contact layer on the barrier layer comprises growing the contact layer to a thickness such that the contact layer does not overlap the conductor in a growth direction of the contact layer.

\* \* \* \* \*